(12) United States Patent
Lee et al.

(10) Patent No.: US 11,428,961 B2
(45) Date of Patent: Aug. 30, 2022

(54) VARIABLE WAVELENGTH LIGHT SOURCE AND APPARATUS INCLUDING THE SAME

(71) Applicant: SAMSUNG ELECTRONICS CO., LTD., Suwon-si (KR)

(72) Inventors: Changbum Lee, Seoul (KR); Changgyun Shin, Anyang-si (KR); Byounglyong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 625 days.

(21) Appl. No.: 16/523,530

(22) Filed: Jul. 26, 2019

(65) Prior Publication Data
US 2020/0103679 A1    Apr. 2, 2020

(30) Foreign Application Priority Data

Oct. 1, 2018 (KR) .......................... 10-2018-0117102

(51) Int. Cl.
*G02F 1/017* (2006.01)
*H01S 5/026* (2006.01)
*H01S 5/50* (2006.01)
*H01S 5/343* (2006.01)

(52) U.S. Cl.
CPC .......... *G02F 1/01708* (2013.01); *H01S 5/026* (2013.01); *H01S 5/343* (2013.01);
(Continued)

(58) Field of Classification Search
CPC ............ G02F 1/01708; G02F 2201/18; G02F 2201/30; G02F 2203/15; G02F 2203/24; G02F 2203/70; H01S 5/026; H01S 5/343; H01S 5/50; H01S 5/0085; H01S 5/0071; H01S 5/4062; H01S 5/4068; H01S 5/021; H01S 5/0261; H01S 5/1092; H01S 5/4006; H01S 5/142; H01S 5/20; H01S 5/34; H01S 5/3432; H01S 5/34326; H01S 5/34333;
(Continued)

(56) References Cited

U.S. PATENT DOCUMENTS 8,488,637 B2 *  7/2013  Fukuda ................. B82Y 20/00
372/50.11
9,793,684 B2   10/2017  Takabayashi et al.
(Continued)

FOREIGN PATENT DOCUMENTS

JP    2010-212472 A    9/2010
KR   10-2017-0098521 A  8/2017

OTHER PUBLICATIONS

Hulme, et al., "Widely tunable Vernier ring laser on hybrid silicon", Aug. 2013, Optics Express, vol. 21, Issue No. 17, pp. 19718-19722, 5 pages total.
(Continued)

*Primary Examiner* — Ellen E Kim
(74) *Attorney, Agent, or Firm* — Sughrue Mion, PLLC (57) ABSTRACT

A variable wavelength light source and an apparatus including the same are disclosed. The variable wavelength light source includes: a first waveguide; a second waveguide spaced apart from the first waveguide; a first optical amplifier including a first gain medium; and a second optical amplifier including a second gain medium that is different from the first gain medium.

29 Claims, 9 Drawing Sheets
(2 of 9 Drawing Sheet(s) Filed in Color)

(52) U.S. Cl.
CPC ............ *H01S 5/50* (2013.01); *G02F 2201/18* (2013.01); *G02F 2201/30* (2013.01); *G02F 2203/15* (2013.01); *G02F 2203/24* (2013.01); *G02F 2203/70* (2013.01)

(58) Field of Classification Search
CPC ... H01S 5/18397; H01S 5/3013; H01S 5/3018
See application file for complete search history.

(56) References Cited

U.S. PATENT DOCUMENTS

| | | | |
|---|---|---|---|
| 2009/0046748 A1* | 2/2009 | Kato | H01S 5/141 372/20 |
| 2009/0154505 A1 | 6/2009 | Oh et al. | |
| 2012/0189025 A1* | 7/2012 | Zheng | H01S 5/1071 372/20 |
| 2017/0179671 A1* | 6/2017 | Takabayashi | H01S 3/1305 |
| 2018/0191134 A1* | 7/2018 | Osinski | H01S 5/142 |

OTHER PUBLICATIONS

Hulme, et al., "Fully integrated hybrid silicon two dimensional beam scanner", Mar. 2015, Optics Express, vol. 23, Issue No. 5, pp. 5861-5874, 14 pages total.

Park, et al., "A Hybrid AlGaInAs-Silicon Evanescent Amplifier", Feb. 2007, IEEE Photonics Technology Letters, vol. 19, Issue No. 4, 4 pages total.

* cited by examiner

VARIABLE WAVELENGTH LIGHT SOURCE AND APPARATUS INCLUDING THE SAME

CROSS-REFERENCE TO RELATED APPLICATION

This application claims priority from and the benefit of Korean Patent Application No. 10-2018-0117102, filed on Oct. 1, 2018, in the Korean Intellectual Property Office, the disclosure of which is incorporated herein in its entirety by reference.

BACKGROUND

1. Field

Various embodiments relate to a variable wavelength light source having an extendable variable wavelength range and an apparatus including the same.

2. Description of the Related Art

Advanced driving assistance systems (ADASs) having various functions have been commercialized. For example, vehicles having an adaptive cruise control (ACC) function of recognizing by a vehicle, a location and a speed of another vehicle, to reduce a speed of the own vehicle when a risk of collision with the other vehicle is expected and to drive the vehicle within a set speed range when no risk of collision is expected have increased. Also, vehicles having an autonomous emergency braking (AEB) system for recognizing a vehicle ahead to prevent collision by automatically braking when a risk of collision is expected but a driver does not respond to the risk of collision or a response is not appropriate have increased. In addition, it is expected that an autonomous vehicle will be commercialized in the close future.

Therefore, an interest of an optical measurement apparatus capable of providing information on the surroundings of a vehicle has increased. For example, a light detection and ranging (LiDAR) system for a vehicle may emit laser beams on a selected region around the vehicle and detect reflected laser beams to provide information on a distance from an object around the vehicle, a relative speed, an azimuth, and the like. To this end, the LiDAR system for a vehicle includes a beam steering apparatus capable of steering beams to a desired region.

To steer laser beams to a desired region, a method of using interference of a bundle-shaped laser beams emitted from a plurality of unit cells or a plurality of waveguides by using a method of mechanically rotating a laser emission part and an optical phased array (OPA) scheme is generally used. According to the OPA scheme, laser beams may be steered by electrically or thermally controlling unit cells or waveguides.

In addition, a beam steering apparatus for adjusting an emission angle according to a characteristic of a diffraction grating by using a variable wavelength light source to achieve beam steering in a vertical direction by using the diffraction grating has been researched.

SUMMARY

Provided is a variable wavelength light source having an extendable variable wavelength range.

Provided is an apparatus including a variable wavelength light source having an extendable variable wavelength range.

Additional aspects will be set forth in part in the description which follows and, in part, will be apparent from the description, or may be learned by practice of the embodiments of the disclosure.

According to an aspect of the disclosure, there is provided a variable wavelength light source comprising: a first waveguide; a second waveguide spaced apart from the first waveguide; first and second resonators provided between the first waveguide and the second waveguide; a first optical amplifier provided on a top surface of the first waveguide and comprising a first gain medium; and a second optical amplifier provided on a top surface of the second waveguide and comprising a second gain medium that is different from the first gain medium.

The first gain medium and the second gain medium may comprise different media from among III-V group compound semiconductor materials and II-VI group compound semiconductor materials.

The first gain medium and the second gain medium may comprise at least one of gallium nitride (GaN), aluminum gallium indium phosphide (AlGaInP), gallium aluminum arsenide (GaAlAs), indium gallium arsenide (InGaAs), indium gallium nitrogen arsenide (InGaNAs), indium gallium arsenic phosphide (InGaAsP), indium aluminum gallium arsenide (InAlGaAs), gallium arsenide (GaAs), gallium phosphide (GaP), aluminum gallium arsenide (AlGaAs), indium gallium phosphide (InGaP), and indium phosphide (InP).

Each of the first gain medium and the second gain medium may have a quantum well structure.

The first gain medium and the second gain medium may be formed such that at least one of a material, a composition, and a thickness of the quantum well structure of the first gain medium is respectively different from at least one of a material, a composition, and a thickness of the quantum well structure of the second gain medium.

The first optical amplifier and the second optical amplifier may have peak wavelengths different from each other.

Each of the first optical amplifier and the second optical amplifier may have a peak wavelength within a range of about 800 nm to about 3000 nm.

Each of the first optical amplifier and the second optical amplifier may have a peak wavelength within a range of about 1100 nm to about 1600 nm.

Each of the first optical amplifier and the second optical amplifier may have a wavelength bandwidth within a range of about 30 nm to about 120 nm.

A synthesized wavelength bandwidth of the first optical amplifier and the second optical amplifier may have a range of about 40 nm to about 240 nm.

Each of the first and second resonators may comprise a ring and a modulator provided at the inner circumference or the outer circumference of the ring.

Each of the first and second waveguides may comprise silicon.

The first optical amplifier may comprise: a first lower cladding layer; a first gain medium layer comprising the first gain medium; and a first upper cladding layer, and wherein the second optical amplifier comprises: a second lower cladding layer; a second gain medium layer comprising the second gain medium; and a second upper cladding layer.

The first and second resonators may be configured to variably change a wavelength by adjusting a voltage or current applied to the first and second resonators.

According to another aspect of the disclosure, there is provided an apparatus comprising: a variable wavelength light source; and at least one optical phased array configured to adjust an output direction of light beams emitted from the variable wavelength light source, wherein the variable wavelength light source comprises: a first waveguide; a second waveguide spaced apart from the first waveguide; first and second resonators provided between the first waveguide and the second waveguide; a first optical amplifier provided on a top surface of the first waveguide and comprising a first gain medium; and a second optical amplifier provided on a top surface of the second waveguide and comprising a second gain medium that is different from the first gain medium.

The first gain medium and the second gain medium may comprise different media from among III-V group compound semiconductor materials and II-VI group compound semiconductor materials.

The first gain medium and the second gain medium may comprise at least one of gallium nitride (GaN), aluminum gallium indium phosphide (AlGaInP), gallium aluminum arsenide (GaAlAs), indium gallium arsenide (InGaAs), indium gallium nitrogen arsenide (InGaNAs), indium gallium arsenic phosphide (InGaAsP), indium aluminum gallium arsenide (InAlGaAs), gallium arsenide (GaAs), gallium phosphide (GaP), aluminum gallium arsenide (AlGaAs), indium gallium phosphide (InGaP), and indium phosphide (InP).

Each of the first gain medium and the second gain medium may have a quantum well structure.

The first gain medium and the second gain medium may be formed such that at least one of a material, a composition, and a thickness of the quantum well structure of the first gain medium is respectively different from at least one of a material, a composition, and a thickness of the quantum well structure of the second gain medium.

The first optical amplifier and the second optical amplifier may have peak wavelengths different from each other.

Each of the first optical amplifier and the second optical amplifier may have a peak wavelength within a range of about 800 nm to about 3000 nm.

Each of the first optical amplifier and the second optical amplifier may have a peak wavelength within a range of about 1100 nm to about 1600 nm.

Each of the first optical amplifier and the second optical amplifier may have a wavelength bandwidth within a range of about 30 nm to about 120 nm.

A synthesized wavelength bandwidth of the first optical amplifier and the second optical amplifier may have a range of about 40 nm to about 240 nm.

Each of the first and second resonators may comprise a ring and a modulator provided at the inner circumference or the outer circumference of the ring.

The first and second resonators may be configured to variably change a wavelength by adjusting a voltage or current applied to the first and second resonators.

The at least one optical phased array may comprise: a waveguide configured to transfer a light beam emitted from the variable wavelength light source; a beam splitter configured to split the light beam transferred through the waveguide; and a phase shifter configured to shift a phase of the light beam.

The apparatus may comprise an antenna comprising a grating configured to adjust a direction of the light beam based on the phase of the light beam shifted by the phase shifter.

The at least one optical phased array may comprise: a first optical phased array coupled to the first waveguide, and a second optical phased array is coupled to the second waveguide.

According to another aspect of the disclosure, there is provided a variable wavelength light source comprising: a substrate; a first waveguide provided on the substrate; a second waveguide provided on the substrate; first and second resonators provided between the first waveguide and the second waveguide; a first optical amplifier provided on the first waveguide between the first and the second resonators; and a second optical amplifier provided on the second waveguide between the first and the second resonators, wherein the first optical amplifier is configured to generate light having a peak wavelength different from the second optical amplifier.

At least one of a material, a composition, and a thickness of a structure of the first optical amplifier may be different from at least one of a material, a composition, and a thickness of a structure of the second optical amplifier.

The first optical amplifier may comprise a first gain medium and the second optical amplifier may comprise a second gain medium different from the first gain medium.

BRIEF DESCRIPTION OF THE DRAWINGS

Color Drawings/Photographs

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of the embodiments, taken in conjunction with the accompanying drawings in which.

DETAILED DESCRIPTION

Hereinafter, a variable wavelength light source according to various embodiments and an apparatus including the same will be described in detail with reference to the accompanying drawings. In the drawings, like reference numerals refer to like elements, and the size of each component in the drawings may be exaggerated for clarity and convenience of description. Although terms, such as 'first' and 'second', can be used to describe various elements, the elements cannot be limited by the terms. The terms can be used to classify a certain element from another element.

An expression in the singular includes an expression in the plural unless they are clearly different from each other in context. In addition, when a component "includes" an element, unless there is another opposite description thereto, it should be understood that the component does not exclude another element but may further include another element. In addition, in the drawings, the thicknesses or sizes of components may be exaggerated for clarity of description. In addition, when it is described that a certain material layer is above a substrate or another layer, the material layer may be directly above the substrate or another layer, or a third layer may be interposed therebetween. In addition, a material forming each layer in the embodiments below are only illustrative, and thus, a material other than the illustrated material may be used.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
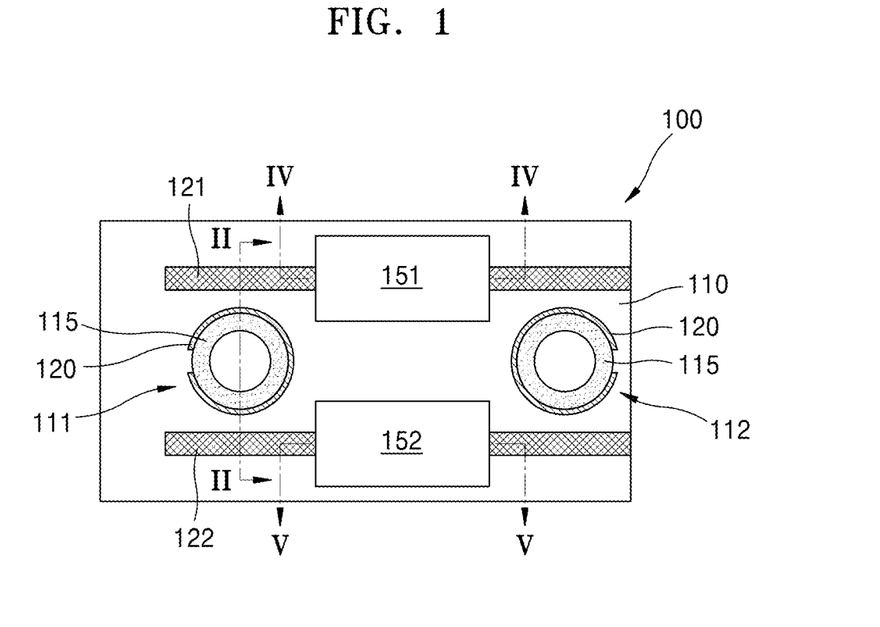
FIG. 1 is a top view of a variable wavelength light source according to an embodiment.

FIG. 1 is a top view of a variable wavelength light source 100 according to an embodiment.

Referring to FIG. 1, the variable wavelength light source 100 may include a first waveguide 121 and a second waveguide 122 provided on a substrate 110. The substrate 110 may be, for example, a silicon substrate. The first waveguide 121 and the second waveguide 122 may be arranged in parallel. Although an example in which the first waveguide 121 and the second waveguide 122 have a straight structure is shown, the first waveguide 121 and the second waveguide 122 are not limited thereto, and the structure of the first waveguide 121 and the second waveguide 122 may be variously modified. The first waveguide 121 and the second waveguide 122 may include a semiconductor material. For example, the first and second waveguides 121 and 122 may include silicon. However, this is only illustrative, and the first and second waveguides 121 and 122 may include other various materials.

A first optical amplifier 151 may be provided on the first waveguide 121. A second optical amplifier 152 may be provided on the second waveguide 122. The first and second optical amplifiers 151 and 152 may be, for example, semiconductor optical amplifiers or ion-doped amplifiers.

Figure 2:
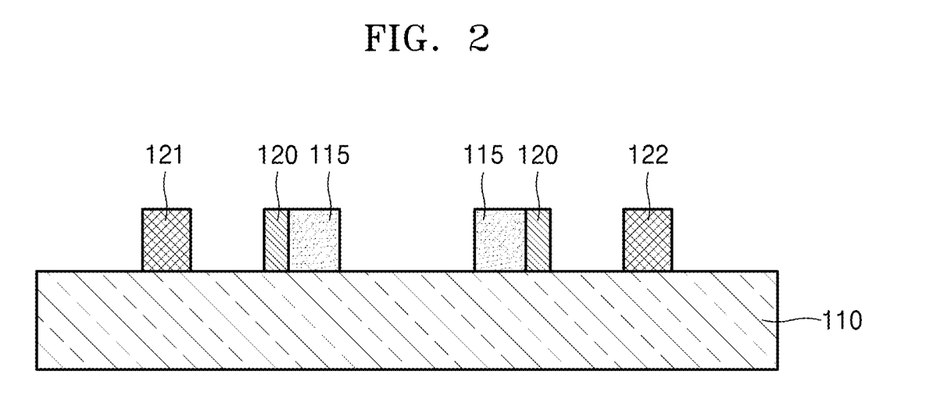
FIG. 2 is a cross-sectional view taken along line II-II of FIG. 1.

A first ring resonator 111 and a second ring resonator 112 may be arranged between the first waveguide 121 and the second waveguide 122 by being spaced apart from each other. FIG. 2 is a cross-sectional view taken along line II-II of FIG. 1. The first and second ring resonators 111 and 112 each includes a ring 115, and a modulator 120 surrounding the ring 115 may be arranged along the outer circumference of the ring 115. Alternatively, the modulator 120 may be provided along the inner circumference of the first and second ring resonators 111 and 112. However, the modulator 120 is not limited thereto, and a shape and a location of the modulator 120 may be variously modified. The ring 115 may include, for example, a semiconductor material such as silicon. The modulator 120 may modulate a propagation constant of the ring 115.

The modulator 120 may include, for example, a heating element, an electrode element, or a piezoelectric element. Herein, the heating element may apply heat to the ring 115 to change a length of the ring 115, and variably change an oscillation wavelength based on a change in a refractive index of the ring 115, the refractive index change occurring according to the length change. The heating element is doped with impurities, for example, doped with impurities at a concentration of about $10^{18}$ to about $10^{19}/cm^3$. The electrode element may apply a current to the surroundings of the ring 115 to change a current density inside the ring 115, and variably change an oscillation wavelength based on a change in a refractive index of the ring 115, the refractive index change occurring according to the current density change. The piezoelectric element may variably change an oscillation wavelength by changing a refractive index of the ring 115 or the surroundings thereof based on deformation according to application of a voltage.

Light amplified by the first optical amplifier 151 may be transferred through the first waveguide 121 and transmitted to the first ring resonator 111. The transmitted light may be circulated in the first ring resonator 111 and then input to the second waveguide 122. Thereafter, the light input to the second waveguide 122 may be amplified by the second optical amplifier 152 and then output to the second waveguide 122. In addition, the light transferred through the second waveguide 122 may be transmitted to the second ring resonator 112 and then transmitted back to the first waveguide 121. In this process, a wavelength of light passing through a corresponding ring resonator may be adjusted according to a voltage or current input to the modulator 120. When light having a desired wavelength is generated while repeating this process, the generated light may be output to the outside through the first waveguide 121 or the second waveguide 122.

Figure 3:
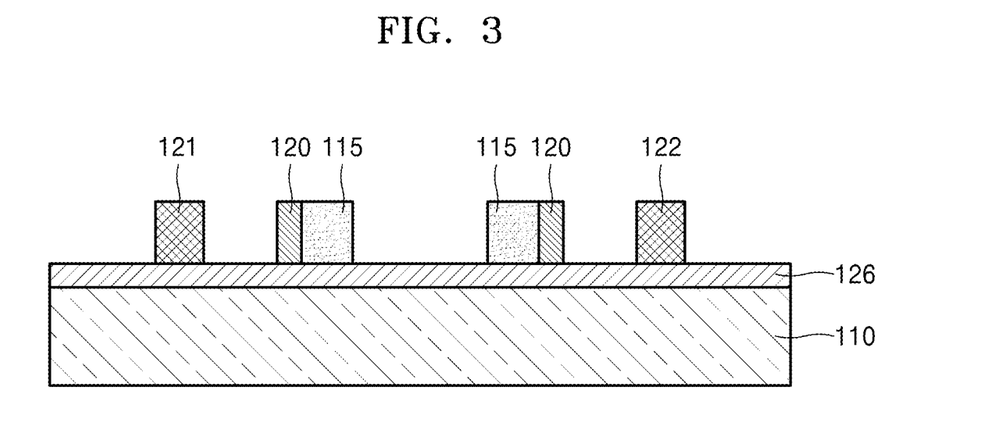
FIG. 3 is a cross-sectional view including a cladding layer in addition to the cross-sectional view of FIG. 2.

FIG. 3 is a cross-sectional view of an example in which a cladding layer 126 is further included on the substrate 110 of FIG. 2. The cladding layer 126 may include, for example, a silicon oxide or the like but is not limited thereto.

The first and second optical amplifiers 151 and 152 may include a semiconductor optical amplifier or an ion-doped amplifier.

The first optical amplifier 151 may include a first gain medium, and the second optical amplifier 152 may include a second gain medium that is different from the first gain medium. The first and second gain media may include, for example, a compound semiconductor. The first and second gain media may include different materials among, for example, III-V group compound semiconductor materials and II-VI group compound semiconductor materials. Herein, the different materials (heterogeneous materials) may include a case of having different material compositions, a case of having the same material composition and different composition ratios, a case of having the same material composition and different thicknesses, a combination thereof, and the like. Alternatively, the different materials may include media allowing the first optical amplifier 151 and the second optical amplifier 152 to generate lights having peak wavelengths different from each other. For example, the first and second gain media may include media having different peak wavelengths within a range of about 800 nm to about 3000 nm, respectively. Herein, the peak wavelength may indicate a peak wavelength of light amplified by each optical amplifier. Alternatively, the different materials may also include a case where the first optical amplifier 151 and the second optical amplifier 152 have the same peak wavelength and different amplification wavelength bands.

Figure 4:
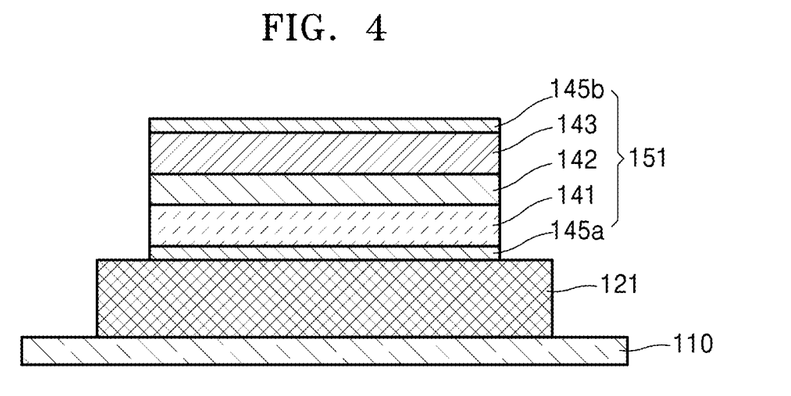
FIG. 4 is a cross-sectional view taken along line IV-IV of FIG. 1.

FIG. 4 is a cross-sectional view taken along line IV-IV of FIG. 1. FIG. 4 is an example of the first optical amplifier 151. The first optical amplifier 151 may include, for example, a lower cladding layer 141, a first gain medium layer 142 including the first gain medium, and an upper cladding layer 143. The first gain medium layer 142 may include a III-V group compound semiconductor material or a II-VI group compound semiconductor material. The first gain medium layer 142 may include any one selected from the group consisting of, for example, gallium nitride (GaN), aluminum gallium indium phosphide (AlGaInP), gallium aluminum arsenide (GaAlAs), indium gallium arsenide (InGaAs), indium gallium nitrogen arsenide (InGaNAs), indium gallium arsenic phosphide (InGaAsP), indium aluminum gallium arsenide (InAlGaAs), gallium arsenide (GaAs), gallium phosphide (GaP), aluminum gallium arsenide (AlGaAs), indium gallium phosphide (InGaP), and indium phosphide (InP). The lower cladding layer 141 and the upper cladding layer 143 may include a semiconductor material having a band gap greater than that of the first gain medium layer 142. The lower cladding layer 141 and the upper cladding layer 143 may include, for example, GaAs, GaP, AlGaAs, InGaP, InP, or the like. A gain medium of the first optical amplifier 151 may be selected according to a wavelength band (energy band gap) of light to be amplified. For example, GaN may have an amplification wavelength band in a range of about 400 nm to about 480 nm, AlGaInP may have an amplification wavelength band in a range of about 530 nm to about 690 nm, GaAlAs may have an amplification wavelength band in a range of about 750 nm to about 900 nm, and InGaAsP may have an amplification wavelength band in a range of about 1200 nm to about 2000 nm. For example, when light having a wavelength of about 1300 nm is amplified, InAlGaAs or InGaAsP may be used.

A conductive layer 145a may be provided to the lower cladding layer 141 and a conductive layer 145b may be provided to the upper cladding layer 143. The conductive layers 145a and 145b may include a conductive material. Alternatively, the conductive layers 145a and 145b may include, for example, at least one selected from the group consisting of titanium (Ti), gold (Au), silver (Ag), platinum (Pt), copper (Cu), aluminum (Al), nickel (Ni), and chromium (Cr), an alloy thereof, a stack thereof, or the like. However, the conductive layer 145 is not limited thereto and may include at least one of indium tin oxide (ITO), indium zinc oxide (IZO), gallium indium zinc oxide (GIZO), aluminum zinc oxide (AZO), gallium zinc oxide (GZO), and zinc oxide (ZnO). The conductive layers 145a and 145b may be an electrode as it is, or a structure in which a separate electrode is coupled to the conductive layers 145a and 145b from the outside is also possible.

A semiconductor optical amplifier does not separately require an exciting laser beam, and may amplify an optical signal by applying an electric field to both sides of a waveguide. When an electric field is applied through the conductive layers 145a and 145b, absorption and stimulated emission of photons occur, wherein electron-hole pairs are generated when photons are absorbed, and on the contrary stimulated emission of photons occurs when electron-hole pairs are bonded. To amplify an optical signal, stimulated emission of photons needs to be greater than absorption of photons. The semiconductor optical amplifier is classified into a Fabry-Perot amplifier (FPA) type and a traveling wave amplifier (TWA) type. The FPA-type semiconductor optical amplifier may cause density reversal in a conduction band at a high energy level to occur by an input current such that stimulated emission occurs due to transition to a valence band at a low energy level, and amplification may be performed by a resonator. The TWA-type semiconductor optical amplifier may suppress reflection on an output surface and a resonance phenomenon through anti-reflection coating on both end surfaces of a semiconductor laser, and thus, the TWA-type semiconductor optical amplifier may have a structure of widening a gain band width more than the FPA-type semiconductor optical amplifier.

The first optical amplifier 151 may have a width greater than that of the first waveguide 121. Accordingly, when light transferred through the first waveguide 121 moves toward the first optical amplifier 151, light leakage may be reduced.

Figure 5:
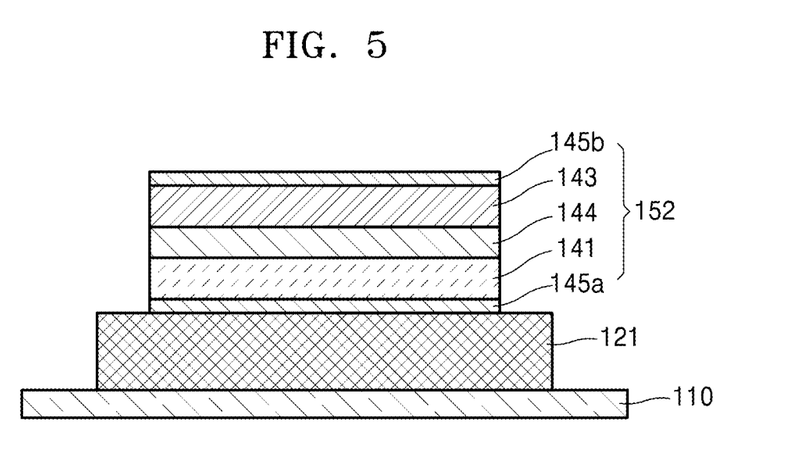
FIG. 5 is a cross-sectional view taken along line V-V of FIG. 1.

FIG. 5 is an example of the second optical amplifier 152. The second optical amplifier 152 may include, for example, the lower cladding layer 141, a second gain medium layer 144 including the second gain medium, and the upper cladding layer 143. The second gain medium layer 144 may include a III-V group compound semiconductor material or a II-VI group compound semiconductor material. The second gain medium layer 144 may include any one selected from the group consisting of, for example, GaN, AlGaInP, GaAlAs, InGaAs, InGaNAs, InGaAsP, InAlGaAs, GaAs, GaP, AlGaAs, InGaP, and InP.

The second gain medium layer 144 may include a medium different from that of the first gain medium layer 142. For example, the first gain medium layer 142 and the second gain medium layer 144 may include materials that cause amplification with different peak wavelengths within a range of about 1100 nm to about 1600 nm, respectively. This may be applied to, for example, a case where a silicon waveguide is used. Alternatively, the first gain medium layer 142 and the second gain medium layer 144 may include materials that cause amplification with peak wavelengths within a range of about 800 nm to about 3000 nm, respectively, according to a material of a waveguide.

For example, the first gain medium layer 142 may include a medium having a peak wavelength of about 1300 nm, and the second gain medium layer 144 may include a medium having a peak wavelength of about 1550 nm. The first gain medium layer 142 and the second gain medium layer 144 each may include a quantum well structure. For example, the first gain medium layer 142 may include $Al_{0.289}Ga_{0.461}In_{0.45}As$, and the second gain medium layer 144 may include $In_{0.6986}Al_{0.178}Ga_{0.1234}As$. This is only illustrative, and a composition ratio may be variously modified.

Figure 6:
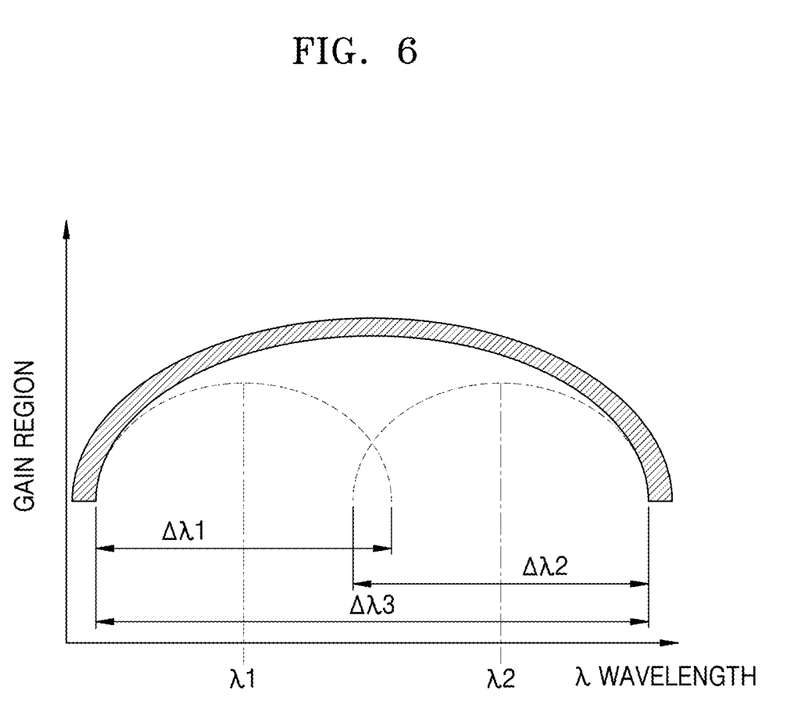
FIG. 6 is a graph showing a gain region according to a wavelength of the variable wavelength light source according to an embodiment.

FIG. 6 is a graph showing a gain region G according to a wavelength $\lambda$ according to an embodiment. It is assumed that a first variable wavelength band by the first optical amplifier 151 is $\Delta\lambda 1$, a second variable wavelength band by the second optical amplifier 152 is $\Delta\lambda 2$, and a synthesized variable wavelength band by the first optical amplifier 151 and the second optical amplifier 152 is $\Delta\lambda 3$. When a peak wavelength of the first optical amplifier 151 is $\lambda 1$ and a peak wavelength of the second optical amplifier 152 is $\lambda 2$, the first optical amplifier 151 and the second optical amplifier 152 may be configured such that $\lambda 1$ differs from $\lambda 2$. In addition, the first optical amplifier 151 and the second optical amplifier 152 may be configured such that the synthesized variable wavelength band satisfies Δλ3≤Δλ1+Δλ2. When the first optical amplifier 151 and the second optical amplifier 152 are configured such that the first variable wavelength band and the second variable wavelength band overlap at a minimum, the synthesized variable wavelength band may be wide. When the synthesized variable wavelength band is wide, a variable wavelength band may be wide, thereby widening a steering range in an optical steering apparatus to be described below. When the first variable wavelength band and the second variable wavelength band are separated from each other, an invariable gap region may occur, and thus, the first optical amplifier 151 and the second optical amplifier 152 may be configured such that the first variable wavelength band and the second variable wavelength band come in contact with or partially overlap each other in a boundary region. By doing this, the variable wavelength band may be widened.

Figure 7:
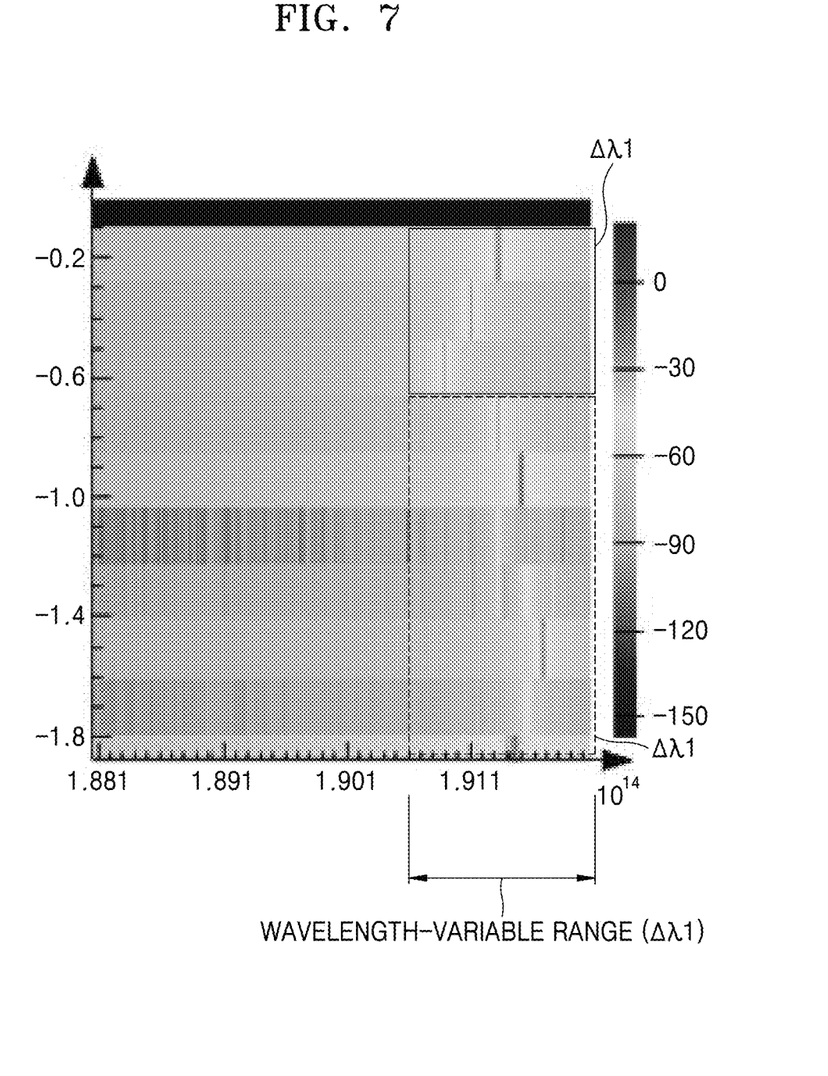
FIG. 7 is a graph showing a wavelength-variable range of a variable wavelength light source, according to a comparative example.
Figure 8:
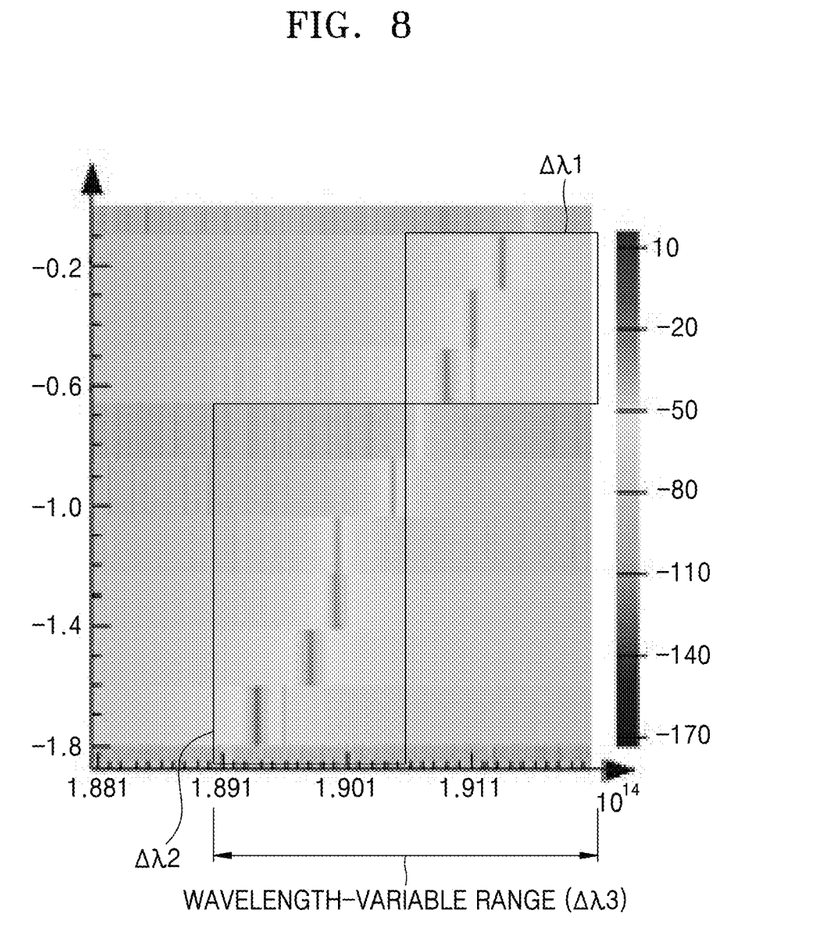
FIG. 8 is a graph showing a wavelength-variable range of the variable wavelength light source according to an embodiment.

FIG. 7 is a graph showing a wavelength-variable range according to a comparative example, and FIG. 8 is a graph showing a wavelength-variable range according to an embodiment. A horizontal axis indicates a frequency, and a vertical axis indicates a voltage applied to an amplifier. In the comparative example, a first optical amplifier and a second optical amplifier are configured using the same gain medium, and in the embodiment, the first optical amplifier and the second optical amplifier are configured using gain media different from each other. According to the comparative example, a wavelength-variable range by the first optical amplifier and a wavelength-variable range by the second optical amplifier almost overlap. On the contrary, according to the embodiment, a wavelength-variable range by the first optical amplifier and a wavelength-variable range by the second optical amplifier are shown in different regions. Therefore, a wavelength-variable range may be widened according to the embodiment.

Figure 9:
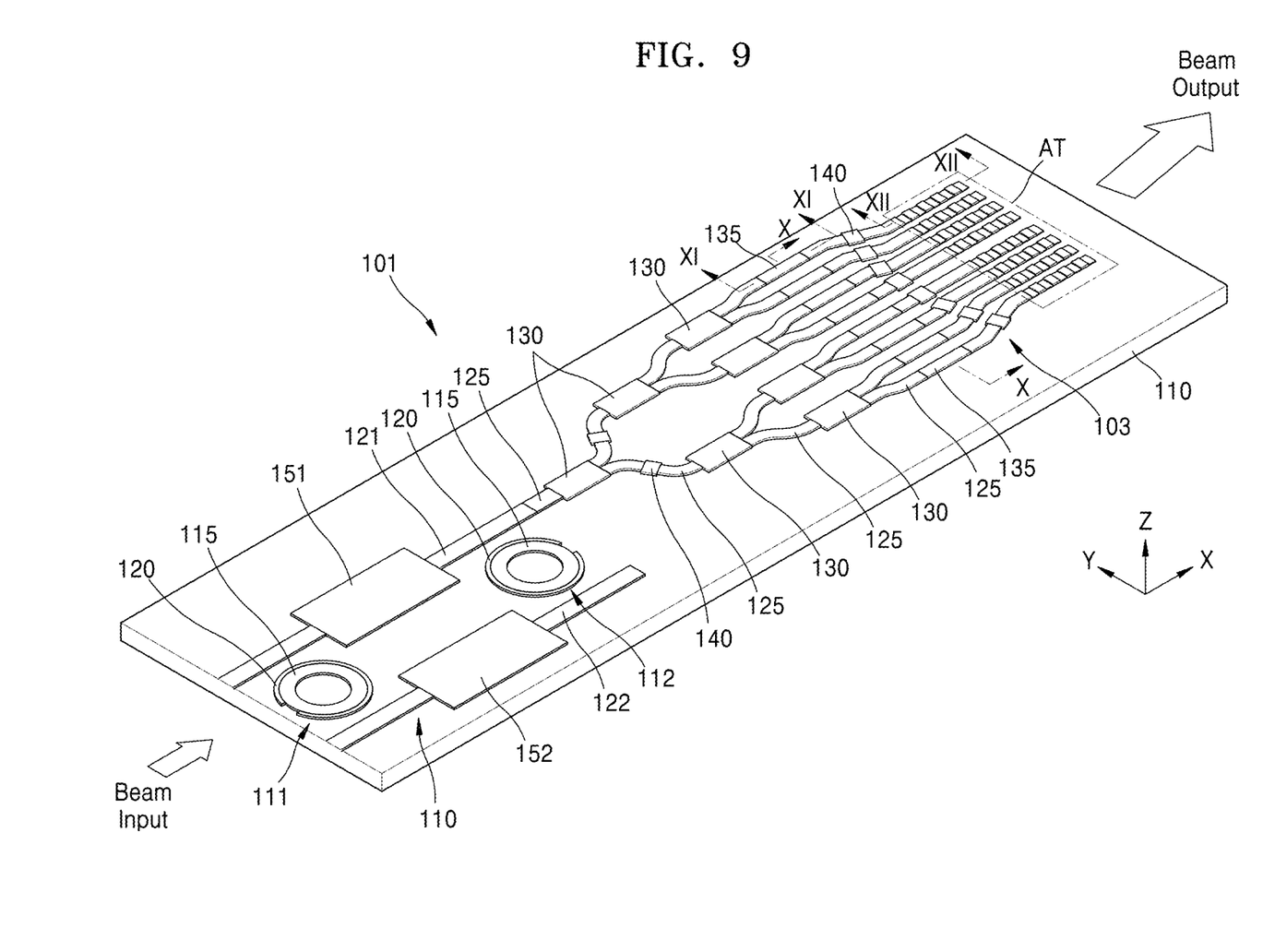
FIG. 9 is a perspective view of a beam steering apparatus according to an embodiment.

FIG. 9 is a perspective view of a beam steering apparatus 101 according to an embodiment.

The beam steering apparatus 101 may include the substrate 110, the variable wavelength light source 100 provided on the substrate 110, and an optical phased array (OPA) 103. FIG. 9 shows an example in which the variable wavelength light source 100 is applied to the beam steering apparatus 101.

The substrate 110 may be, for example, a silicon substrate. However, the substrate 110 is not limited thereto. The variable wavelength light source 100 is the same as described with reference to FIG. 5.

One of the first waveguide 121 and the second waveguide 122 of the variable wavelength light source 100 may be coupled to the OPA 103.

The OPA 103 may be configured to adjust an output direction of a beam emitted from the variable wavelength light source 100. FIG. 9 shows an example of the OPA 103.

The OPA 103 may include a third waveguide 125 configured to transfer a beam emitted from the variable wavelength light source 100, a beam splitter 130 configured to split the light beam transferred through the third waveguide 125, and a phase shifter 135 configured to shift a phase of the light beam.

One of the first waveguide 121 and the second waveguide 122 may be connected to the third waveguide 125. Although different reference signs are used, one of the first waveguide 121 and the second waveguide 122 may be integratedly connected to the third waveguide 125. FIG. 9 shows an example in which the first waveguide 121 is connected to the third waveguide 125. The third waveguide 125 may be divided into a plurality of third waveguides 125 by beam splitters 130. FIG. 9 shows an example in which the third waveguide 125 is divided into eight third waveguides 125 by seven beam splitters 130. Phase shifters 135 may be respectively provided to the third waveguides 125 divided by the beam splitters 130. The phase shifters 135 each may independently shift a phase of a light beam passing through the third waveguide 125 when an electrical signal is applied thereto.

Figure 10:
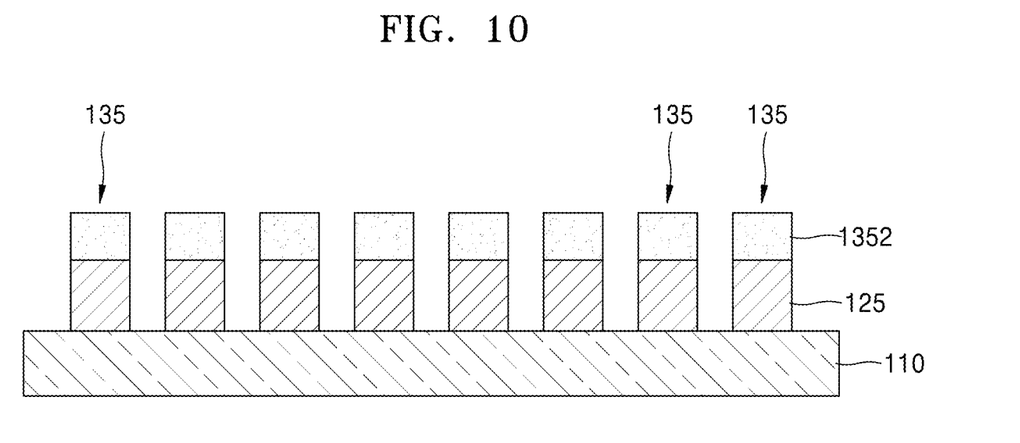
FIG. 10 is a cross-sectional view taken along line X-X of FIG. 9.
Figure 11:
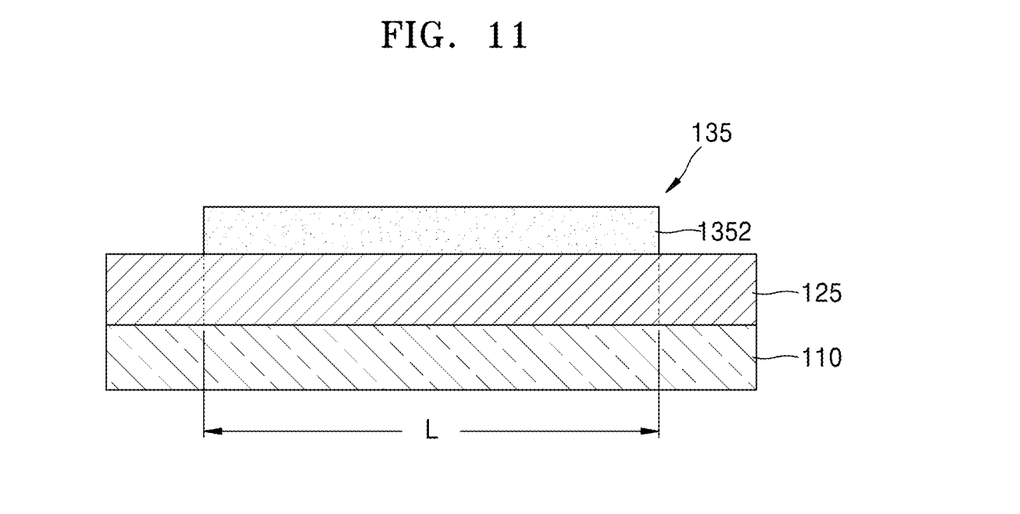
FIG. 11 is a cross-sectional view taken along line XI-XI of FIG. 9.

FIG. 10 is a cross-sectional view taken along line X-X of FIG. 9, and FIG. 11 is a cross-sectional view taken along line XI-XI of FIG. 9. Referring to FIGS. 10 and 11, the phase shifters 135 each may include the third waveguide 125 provided on the substrate 110 and a cladding layer 1352.

The cladding layer 1352 may be provided on an upper surface of the third waveguide 125. The cladding layer 1352 may be provided to modulate a phase of a light beam passing through the third waveguide 125. To this end, the cladding layer 1352 may include a material of which a refractive index is changed according to application of an electrical signal.

The cladding layer 1352 may include, for example, an oxide semiconductor. The cladding layer 1352 may include a transparent conductive oxide (TCO) which is a material having a relatively large change in a refractive index according to application of an electrical signal. Herein, the TCO may include at least one of, for example, ITO, IZO, GIZO, AZO, GZO, and ZnO. However, the TCO is not limited thereto. The cladding layer 1352 may form a p-n junction structure with the third waveguide 125.

When an electrical signal such as a voltage is applied to the cladding layer 1352 in the phase shifter 135, a carrier density inside the cladding layer 1352 may be changed at an interface between the cladding layer 1352 and the third waveguide 125, and a refractive index of the cladding layer 1352 may be changed according to the change in the carrier density. When the refractive index of the cladding layer 1352 is changed, a phase of a light beam passing through the third waveguide 125 at a lower part of the cladding layer 1352 may be modulated due to evanescent wave interference. In FIG. 11, L denotes a length of a phase modulation section, i.e., a length of the phase shifter 135 according to a traveling direction of a light beam.

Referring to the OPA 103 shown in FIG. 9, to which the phase shifter 135 is applied, a light beam is incident to one third waveguide 125 and then output by passing through the plurality of third waveguides 125 branched by the beam splitters 130, and the light beams may be emitted on a particular location due to interference of these output bundle-shaped light beams. Hereon, the light beams passing through the third waveguides 125 may be output after phases of the light beams are modulated by the phase shifters 135, and thus, thereby determining a phase profile of the finally output bundle-shaped light beams. In addition, since a traveling direction of light is determined according to the phase profile, the light beams may be emitted on a desired location. The phase shifters 135 may perform scanning by adjusting a traveling direction of light beams. For example, the phase shifters 135 may perform scanning in a horizontal direction of the substrate 110, i.e., a Y direction in FIG. 9, by using light beams. Herein, the horizontal direction may be a direction (Y direction) in which the plurality of third waveguides 125 are arranged at an end portion of the OPA 103. The horizontal direction of the substrate 110 may also include an oblique direction or a curved direction.

A method of changing a refractive index of a waveguide to modulate a phase of a light beam passing through the waveguide may be used. Herein, examples of the method of changing the refractive index of the waveguide may include a method using heat and a method using electricity. According to the method using heat, a phase change is large, and the waveguide may be formed of various materials, but a speed is slow, a certain gap or more between waveguides needs to be secured because of severe interference between the waveguides, and it is difficult to secure a wide field of view (FOV). In addition, according to the method using electricity, a speed is fast, and a wide FOV may be obtained since there is no interference between waveguides, but a long waveguide is needed since a phase change is small, and a waveguide material is limited to a semiconductor material such as silicon (Si) since a p-n or p-i-n junction structure is required, and thus, laser beams of various wavelengths may not be steered.

In the beam steering apparatus 101 according to the embodiment, each of the phase shifters 135 may include the cladding layer 1352 of which a refractive index is changed according to application of an electrical signal to the third waveguide 125 to modulate a phase of a light beam passing through the third waveguide 125. According to the embodiment, a phase of a light beam passing through the third waveguide 125 due to evanescent wave interference by changing the refractive index of the cladding layer 1352 provided around the third waveguide 125 instead of changing a refractive index of the third waveguide 125. Since the refractive index of the third waveguide 125 is not changed, a beam loss is small, and various materials such as silicon and silicon nitride may be used as a material of the third waveguide 125, and thus, light beams of various wavelengths may be steered. In addition, since an electrical signal instead of heat is used, a speed is fast, and a gap between third waveguides 125 may be narrowed, and thus, a wide FOV may be secured.

An antenna AT may be further included at end portions of the third waveguides 125 extending from the phase shifters 135.

Figure 12:
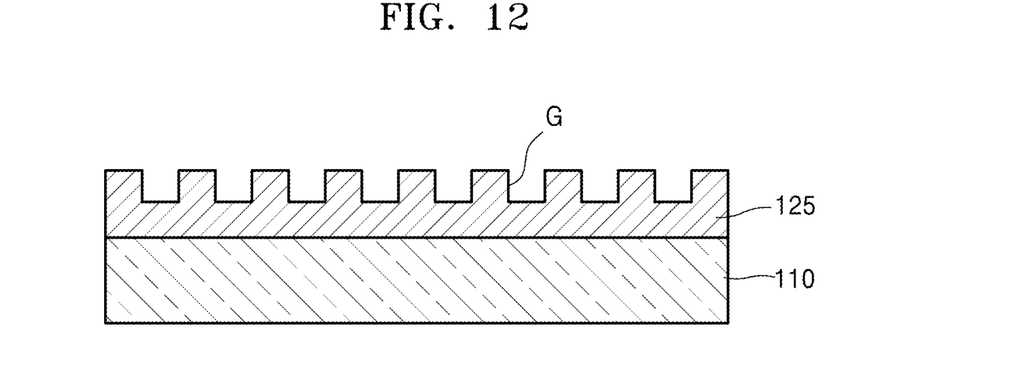
FIG. 12 is a cross-sectional view taken along line XII-XII of FIG. 9.

FIG. 12 is a cross-sectional view taken along line XII-XII of FIG. 9.

The antenna AT may include a grating G formed on the third waveguide 125. A traveling direction of a light beam may be adjusted according to a size, a depth, a pitch, and the like of the grating G. The antenna AT may perform scanning by adjusting a traveling direction of a light beam in a vertical direction of the substrate 110 (Z direction of FIG. 9) according to a wavelength of light output from the variable wavelength light source 100. That is, when the wavelength of the light is λ1 and λ2, a traveling direction of the light in the vertical direction may be changed by the antenna AT. Herein, the vertical direction may include an oblique direction. As a wavelength-variable range of the variable wavelength light source 100 is wide, a vertical-direction scanning range (vertical FOV) of light by the antenna AT may be wide. For example, when a gain medium having a peak wavelength of about 1500 nm is used, the wavelength-variable range may be about 40 nm, and when beam steering is performed using this gain medium, a vertical FOV of about 5.2° may be obtained. When a gain medium having a peak wavelength of about 1300 nm is used, the wavelength-variable range may be about 50 nm, and when beam steering is performed using this gain medium, a vertical FOV of about 6.8° may be obtained. In addition, a first gain medium having a peak wavelength of about 1300 nm and a second gain medium having a peak wavelength of about 1500 nm may be used to widen the wavelength-variable range. By implementing a first variable wavelength band by a first gain medium and implementing a second variable wavelength band by a second gain medium in a variable wavelength light source according to an embodiment, a synthesized variable wavelength band of the first and second gain media may be widened. Therefore, a vertical scanning range may be widened by using heterogeneous gain media.

In the beam steering apparatus 101 according to the embodiment, the phase shifters 135 may perform scanning in the horizontal direction of the substrate 110 (Y direction of FIG. 9) by using light beams, and the variable wavelength light source 100 and the antenna AT may perform scanning in the vertical direction of the substrate 110 by using light.

Figure 13:
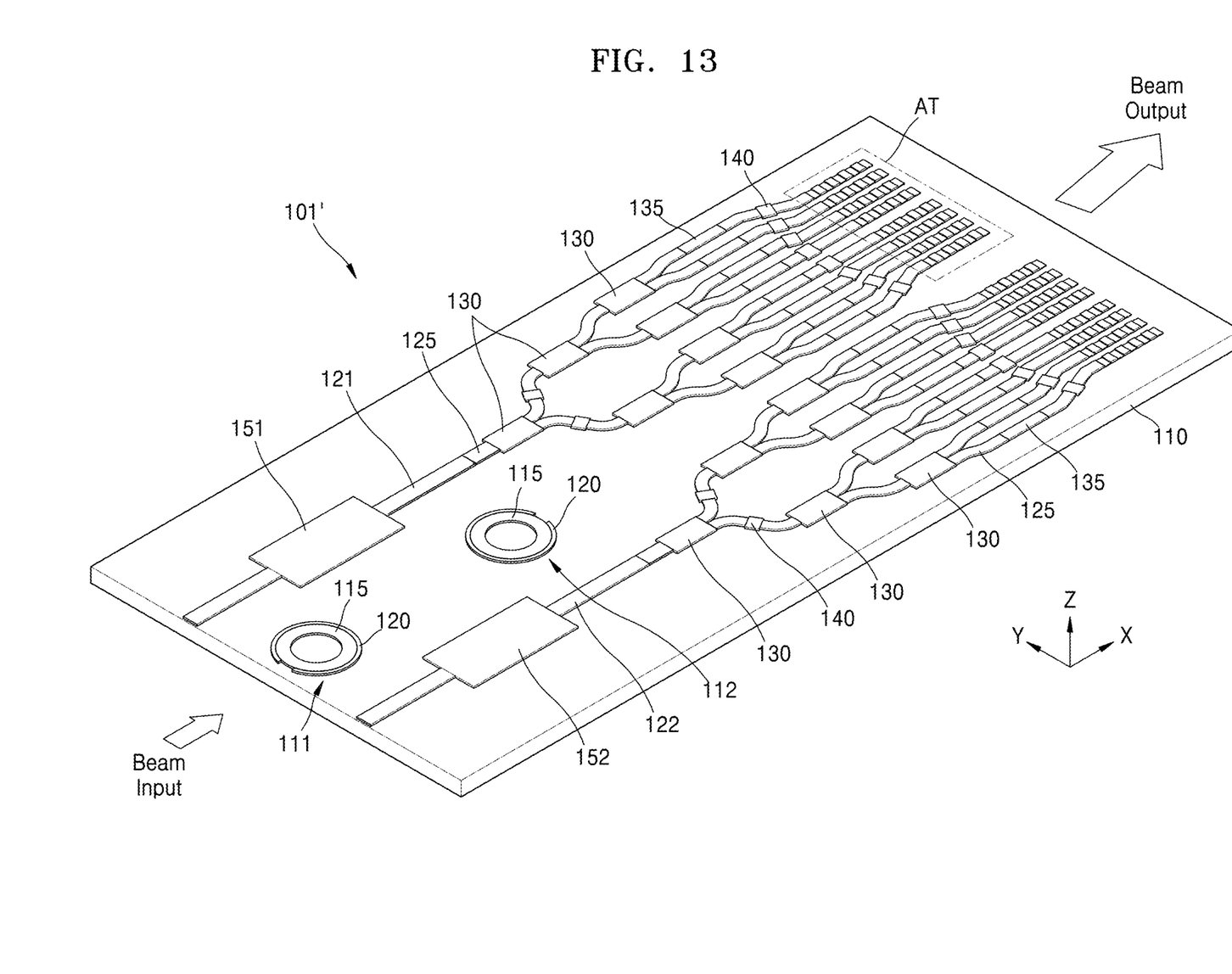
FIG. 13 is a perspective view of a beam steering apparatus according to another embodiment.

FIG. 13 is a perspective view of a beam steering apparatus 101' including two OPAs 103, according to another embodiment.

The beam steering apparatus 101' may include the variable wavelength light source 100 and the two OPAs 103. The variable wavelength light source 100 and the OPAs 103 are the same as described with reference to FIGS. 1 to 12, and thus a detailed description thereof is omitted. The first waveguide 121 of the variable wavelength light source 100 may be coupled to one OPA 103, and the second waveguide 122 may be coupled to the other OPA 103.

By using the two OPAs 103, a scanning range in the horizontal direction (Y direction) may be wider than that of one OPA. In addition, all of light beams output through the first waveguide 121 and the second waveguide 122 of the variable wavelength light source 100 may be used, and thus, light efficiency may be increased. In addition, a scanning range in the vertical direction (Z direction) may be widened by extending a wavelength-variable range of the variable wavelength light source 100. Therefore, a scanning range for an object may be extended in the horizontal direction and the vertical direction. In addition, a scanning speed may be increased. Although one variable wavelength light source is used herein, two or more variable wavelength light sources and OPAs corresponding to the two or more variable wavelength light sources may be provided.

Figure 14:
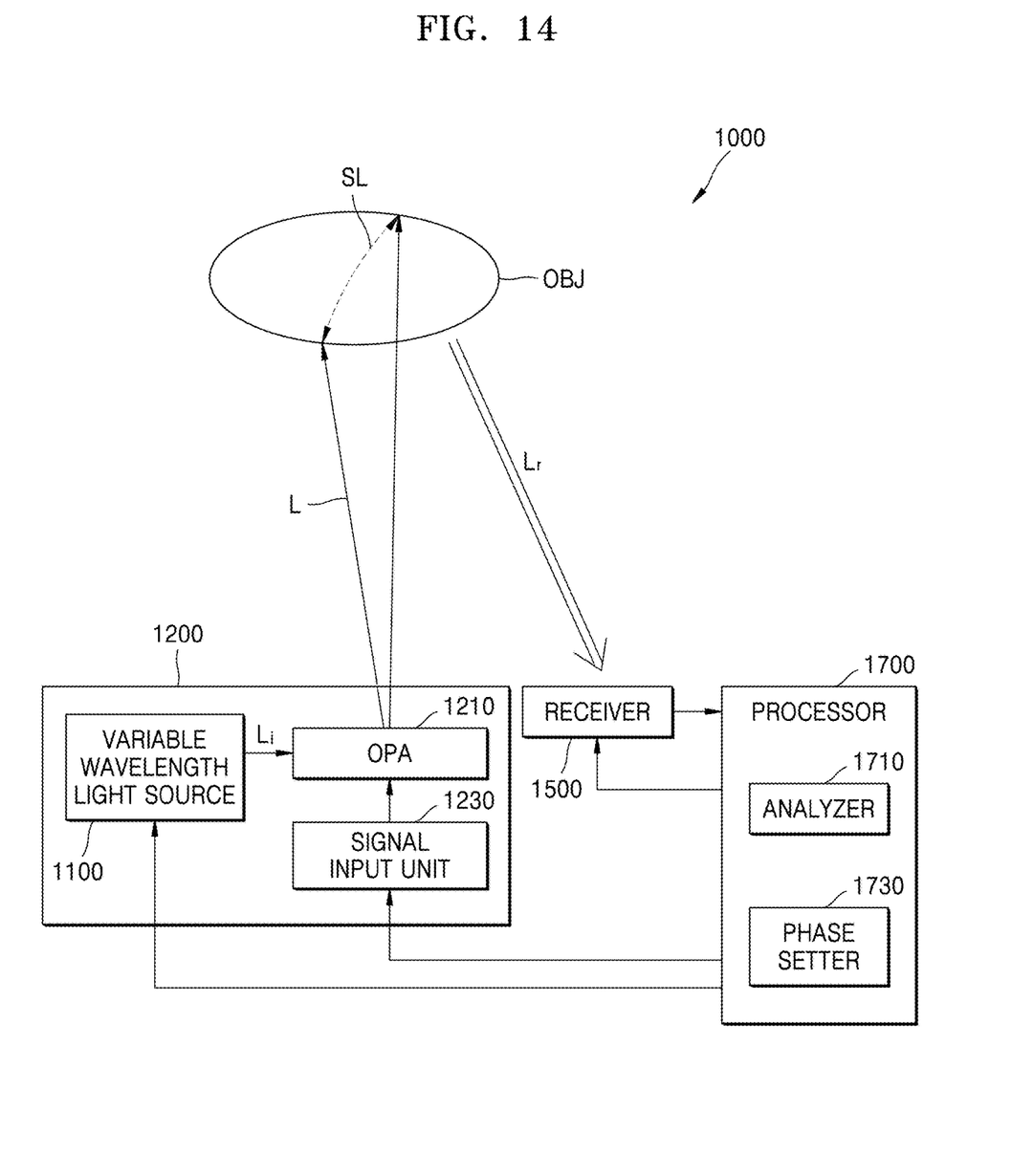
FIG. 14 is a perspective view of an apparatus according to an embodiment.

FIG. 14 is a perspective view of an apparatus 1000 according to an embodiment.

The apparatus 1000 may include a beam steering apparatus 1200 configured to control a traveling direction of light, a receiver 1500 configured to receive light beams reflected from an object OBJ, and a processor 1700 configured to analyze location-based distribution and/or time-based distribution of light received by the receiver 1500 and separately process light emitted on the object OBJ in a plurality of directions.

The beam steering apparatus 1200 may include a variable wavelength light source 1100 and at least one OPA 1210 configured to modulate a phase of a light beam from the variable wavelength light source 1100 and output light in a plurality of directions toward the object OBJ. The embodiments described with reference to FIGS. 1 to 6 and 8 to 13 may be applied to the beam steering apparatus 1200.

The variable wavelength light source 1100 may emit a light beam to be used to analyze a location and a shape of the object OBJ. The variable wavelength light source 1100 may be configured to generate and emit light of a certain wavelength, for example, to emit light of a wavelength band suitable for analysis of the location and the shape of the object OBJ. The variable wavelength light source 1100 may generate and emit pulsed light or continuous light. The variable wavelength light source 1100 may include two optical amplifiers including heterogeneous gain media to extend a wavelength-variable range.

The OPA 1210 may adjust horizontal-direction scanning of light by modulating a phase of an incident light beam. In addition, a signal input unit 1230 configured to apply a modulation signal to the OPA 1210 may be included. The OPA 1210 may be controlled by the processor 1700.

The processor 1700 may control a general operation of the apparatus 1000. The processor 1700 may include an analyzer 1710 configured to analyze location-based distribution and/or time-based distribution of light received by the receiver 1500 and separately process light emitted on the object OBJ from the OPA 1210.

The processor 1700 may also include a phase setter 1730 configured to set a phase profile to form a plurality of directions of light output from the OPA 1210, and to control the signal input unit 1230 according to the phase profile. Besides, the processor 1700 may control operations of the variable wavelength light source 1100 and the receiver 1500. For example, the processor 1700 may perform power supply control, on/off control, pulse wave (PW) or continuous wave (CW) generation control, and the like of the variable wavelength light source 1100.

The apparatus 1000 may be applied to, for example, a light detection and ranging (LiDAR) system. The LiDAR system may detect a distance to an object, a direction, a speed, a temperature, a matter distribution, a density characteristic, and the like by emitting a laser beam on a target. The LiDAR system may be applied to a laser scanner and a three-dimensional (3D) image camera for an autonomous vehicle. Examples of the LiDAR system may include a LiDAR system for a vehicle, a LiDAR system for a robot, a LiDAR system for a drone, and the like.

Besides, a beam steering apparatus according to various embodiments may be applied to an intruder detection system for security, a subway screen door obstacle detection system, a depth sensor, a user face recognition sensor for a mobile phone, an augmented reality (AR) system, motion recognition and object profiling in a TV or a game machine, and the like.

In addition, a variable wavelength light source according to various embodiments may be applied to a wavelength division multiplexing (WDM) apparatus. In the WDM apparatus, a plurality of wavelengths are simultaneously transmitted through one optical fiber to effectively respond to communication traffic. To this end, a variable wavelength laser may be used. In addition, the variable wavelength light source according to various embodiments may be applied to an optical coherence tomography apparatus.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A variable wavelength light source comprising:
    a first waveguide;
    a second waveguide spaced apart from the first waveguide;
    first and second resonators provided between the first waveguide and the second waveguide;
    a first optical amplifier provided on the first waveguide and comprising a first gain medium; and
    a second optical amplifier provided on the second waveguide and comprising a second gain medium that is different from the first gain medium.

2. The variable wavelength light source of claim 1, wherein the first gain medium and the second gain medium comprise different media from among III-V group compound semiconductor materials and II-VI group compound semiconductor materials.

3. The variable wavelength light source of claim 1, wherein the first gain medium and the second gain medium comprise at least one of gallium nitride (GaN), aluminum gallium indium phosphide (AlGaInP), gallium aluminum arsenide (GaAlAs), indium gallium arsenide (InGaAs), indium gallium nitrogen arsenide (InGaNAs), indium gallium arsenic phosphide (InGaAsP), indium aluminum gallium arsenide (InAlGaAs), gallium arsenide (GaAs), gallium phosphide (GaP), aluminum gallium arsenide (AlGaAs), indium gallium phosphide (InGaP), and indium phosphide (InP).

4. The variable wavelength light source of claim 1, wherein each of the first gain medium and the second gain medium has a quantum well structure.

5. The variable wavelength light source of claim 4, wherein the first gain medium and the second gain medium are formed such that at least one of a material, a composition, and a thickness of the quantum well structure of the first gain medium is respectively different from at least one of a material, a composition, and a thickness of the quantum well structure of the second gain medium.

6. The variable wavelength light source of claim 1, wherein the first optical amplifier and the second optical amplifier have peak wavelengths different from each other.

7. The variable wavelength light source of claim 6, wherein each of the first optical amplifier and the second optical amplifier has a peak wavelength within a range of about 800 nm to about 3000 nm.

8. The variable wavelength light source of claim 7, wherein each of the first optical amplifier and the second optical amplifier has a peak wavelength within a range of about 1100 nm to about 1600 nm.

9. The variable wavelength light source of claim 1, wherein each of the first optical amplifier and the second optical amplifier has a wavelength bandwidth within a range of about 30 nm to about 120 nm.

10. The variable wavelength light source of claim 1, wherein a synthesized wavelength bandwidth of the first optical amplifier and the second optical amplifier has a range of about 40 nm to about 240 nm.

11. The variable wavelength light source of claim 1, wherein each of the first and second resonators comprises a ring and a modulator provided at an inner circumference or an outer circumference of the ring.

12. The variable wavelength light source of claim 1, wherein each of the first and second waveguides comprises silicon.

13. The variable wavelength light source of claim 1, wherein the first optical amplifier comprises:
    a first lower cladding layer;
    a first gain medium layer comprising the first gain medium; and
    a first upper cladding layer, and wherein the second optical amplifier comprises:
a second lower cladding layer;
a second gain medium layer comprising the second gain medium; and
a second upper cladding layer.

14. The variable wavelength light source of claim 1, wherein the first and second resonators are configured to variably change a wavelength by adjusting a voltage or current applied to the first and second resonators.

15. An apparatus comprising:
a variable wavelength light source; and
at least one optical phased array configured to adjust an output direction of light beams emitted from the variable wavelength light source,
wherein the variable wavelength light source comprises:
a first waveguide;
a second waveguide spaced apart from the first waveguide;
first and second resonators provided between the first waveguide and the second waveguide;
a first optical amplifier provided on the first waveguide and comprising a first gain medium; and
a second optical amplifier provided on the second waveguide and comprising a second gain medium that is different from the first gain medium.

16. The apparatus of claim 15, wherein the first gain medium and the second gain medium comprise different media from among III-V group compound semiconductor materials and II-VI group compound semiconductor materials.

17. The apparatus of claim 15, wherein the first gain medium and the second gain medium comprise at least one of gallium nitride (GaN), aluminum gallium indium phosphide (AlGaInP), gallium aluminum arsenide (GaAlAs), indium gallium arsenide (InGaAs), indium gallium nitrogen arsenide (InGaNAs), indium gallium arsenic phosphide (InGaAsP), indium aluminum gallium arsenide (InAlGaAs), gallium arsenide (GaAs), gallium phosphide (GaP), aluminum gallium arsenide (AlGaAs), indium gallium phosphide (InGaP), and indium phosphide (InP).

18. The apparatus of claim 15, wherein each of the first gain medium and the second gain medium has a quantum well structure.

19. The apparatus of claim 18, wherein the first gain medium and the second gain medium are formed such that at least one of a material, a composition, and a thickness of the quantum well structure of the first gain medium is respectively different from at least one of a material, a composition, and a thickness of the quantum well structure of the second gain medium.

20. The apparatus of claim 15, wherein the first optical amplifier and the second optical amplifier have peak wavelengths different from each other.

21. The apparatus of claim 20, wherein each of the first optical amplifier and the second optical amplifier has a peak wavelength within a range of about 800 nm to about 3000 nm.

22. The apparatus of claim 21, wherein each of the first optical amplifier and the second optical amplifier has a peak wavelength within a range of about 1100 nm to about 1600 nm.

23. The apparatus of claim 15, wherein each of the first optical amplifier and the second optical amplifier has a wavelength bandwidth within a range of about 30 nm to about 120 nm.

24. The apparatus of claim 15, wherein a synthesized wavelength bandwidth of the first optical amplifier and the second optical amplifier has a range of about 40 nm to about 240 nm.

25. The apparatus of claim 15, wherein each of the first and second resonators comprises a ring and a modulator provided at an inner circumference or an outer circumference of the ring.

26. The apparatus of claim 15, wherein the first and second resonators are configured to variably change a wavelength by adjusting a voltage or current applied to the first and second resonators.

27. The apparatus of claim 15, wherein the at least one optical phased array comprises:
a waveguide configured to transfer a light beam emitted from the variable wavelength light source;
a beam splitter configured to split the light beam transferred through the waveguide; and
a phase shifter configured to shift a phase of the light beam.

28. The apparatus of claim 27, further comprising an antenna comprising a grating configured to adjust a direction of the light beam based on the phase of the light beam shifted by the phase shifter.

29. The apparatus of claim 15, wherein the at least one optical phased array comprises:
a first optical phased array coupled to the first waveguide, and
a second optical phased array is coupled to the second waveguide.

* * * * *